US 12,142,479 B2

(12) United States Patent
Sharma

(10) Patent No.: US 12,142,479 B2
(45) Date of Patent: Nov. 12, 2024

(54) FORMATION OF SiOCN THIN FILMS

(71) Applicant: ASM IP Holding B.V., Almere (NL)

(72) Inventor: Varun Sharma, Helsinki (FI)

(73) Assignee: ASM IP Holding B.V., Almere (NL)

( * ) Notice: Subject to any disclaimer, the term of this patent is extended or adjusted under 35 U.S.C. 154(b) by 334 days.

(21) Appl. No.: 17/140,997

(22) Filed: Jan. 4, 2021

(65) Prior Publication Data

US 2021/0225633 A1 Jul. 22, 2021

Related U.S. Application Data

(60) Provisional application No. 62/962,667, filed on Jan. 17, 2020.

(51) Int. Cl.
*H01L 21/31* (2006.01)
*H01L 21/02* (2006.01)
*H01L 21/469* (2006.01)

(52) U.S. Cl.
CPC ...... *H01L 21/0228* (2013.01); *H01L 21/0214* (2013.01); *H01L 21/02315* (2013.01)

(58) Field of Classification Search
CPC ............. H01L 21/022; H01L 21/02211; H01L 21/02315; H01L 21/02126; H01L 21/02118; H01L 21/02164; H01L 21/0214; H01L 21/0228; H01L 21/76264; H01L 21/76224; H01L 21/76205
USPC ......................................................... 438/778
See application file for complete search history.

(56) References Cited

U.S. PATENT DOCUMENTS

| | | | |
|---|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |

(Continued)

FOREIGN PATENT DOCUMENTS

| | | | | |
|---|---|---|---|---|
| CN | 1265110 A | * | 8/2000 | ....... H01L 21/02123 |
| EP | 0387403 | | 9/1990 | |

(Continued)

OTHER PUBLICATIONS

Filler; Michael et al., Carboxylic Acid Chemistry at the Ge(100)-2x1 Interface: Bidentate Bridging Structure Formation on a Semiconductor Surface, Published, Dec. 22, 2005, J. Am. Chem. Soc. 2006, 128, 3, 770-779. (Year: 2005).*

(Continued)

*Primary Examiner* — Ismail A Muse
(74) *Attorney, Agent, or Firm* — Banner & Witcoff, Ltd.

(57) ABSTRACT

Methods for depositing silicon-containing thin films on a substrate in a reaction space are provided. The methods can include vapor deposition processes comprising at least one deposition cycle including sequentially contacting the substrate with a silicon precursor comprising a halosilane and a second reactant comprising an acyl halide. In some embodiments a Si(O,C,N) thin film is deposited and the concentration of nitrogen and carbon in the film can be tuned by adjusting the deposition conditions.

17 Claims, 4 Drawing Sheets

(56) References Cited

U.S. PATENT DOCUMENTS

| | | |
|---|---|---|
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,645,947 A | 7/1997 | Hirooka et al. |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,159,871 A | 12/2000 | Loboda et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,410,462 B1 | 6/2002 | Yang et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,583,048 B2 | 6/2003 | Vincent et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,048,900 B2 | 5/2006 | Mathur et al. |
| 7,074,690 B1 | 7/2006 | Gauri et al. |
| 7,115,534 B2 | 10/2006 | Nguyen et al. |
| 7,115,974 B2 | 10/2006 | Wu et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,771,533 B2 | 8/2010 | Tois et al. |
| 7,776,396 B2 | 8/2010 | Kobrin et al. |
| 7,794,798 B2 | 9/2010 | Hautala |
| 7,824,492 B2 | 11/2010 | Tois et al. |
| 8,217,446 B2 | 7/2012 | Fukuzumi et al. |
| 8,637,411 B2 | 1/2014 | Swaminathan et al. |
| 8,647,993 B1 | 2/2014 | LaVoie et al. |
| 8,703,624 B2 | 4/2014 | Yang et al. |
| 9,076,646 B2 | 7/2015 | Sims et al. |
| 9,111,746 B2 | 8/2015 | Ranjan et al. |
| 9,171,736 B2 | 10/2015 | Raley et al. |
| 9,200,167 B2 | 12/2015 | Spence et al. |
| 9,243,324 B2 | 1/2016 | Bowen et al. |
| 9,287,113 B2 | 3/2016 | Kang et al. |
| 9,425,038 B2 | 8/2016 | Shimizu |
| 9,425,097 B1 | 8/2016 | Bouche et al. |
| 9,443,718 B2 | 9/2016 | Harada et al. |
| 9,455,138 B1 | 9/2016 | Fukazawa et al. |
| 9,472,391 B2 | 10/2016 | Shimamoto et al. |
| 9,620,357 B2 | 4/2017 | Hashimoto et al. |
| 9,784,695 B2 | 10/2017 | Blendl |
| 9,786,491 B2 | 10/2017 | Suzuki et al. |
| 9,786,492 B2 | 10/2017 | Suzuki et al. |
| 9,865,455 B1 * | 1/2018 | Sims ............ C23C 16/45527 |
| 9,895,715 B2 | 2/2018 | Haukka et al. |
| 10,008,428 B2 | 6/2018 | Kang et al. |
| 10,186,420 B2 | 1/2019 | Fukazawa |
| 10,424,476 B2 | 9/2019 | Suzuki et al. |
| 10,424,477 B2 | 9/2019 | Niskanen et al. |
| 10,453,675 B2 | 10/2019 | O'Neill |
| 10,504,901 B2 | 12/2019 | Yoo et al. |
| 10,510,529 B2 | 12/2019 | Suzuki et al. |
| 10,600,637 B2 | 3/2020 | Suzuki et al. |
| 10,787,591 B2 | 9/2020 | Tsotsis et al. |
| 10,847,529 B2 | 11/2020 | Yoo et al. |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0155722 A1 * | 10/2002 | Satta ............ H01L 23/53252 257/E21.582 |
| 2002/0182320 A1 | 12/2002 | Leskela et al. |
| 2003/0015764 A1 | 1/2003 | Raaijmakers |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |

(56) References Cited

U.S. PATENT DOCUMENTS

| | | |
|---|---|---|
| 2003/0104126 A1 | 6/2003 | Fang et al. |
| 2003/0119305 A1 | 6/2003 | Huang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0163927 A1 | 7/2005 | McSwiney et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1* | 4/2006 | Elers ............... H01L 21/76807 257/E21.582 |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0228903 A1 | 10/2006 | McSwiney et al. |
| 2006/0240187 A1 | 10/2006 | Weidman |
| 2007/0054046 A1 | 3/2007 | Ishizaka et al. |
| 2007/0072427 A1 | 3/2007 | Fukushima et al. |
| 2007/0148350 A1 | 6/2007 | Rahtu et al. |
| 2007/0218670 A1 | 9/2007 | Ishizaka |
| 2007/0232082 A1 | 10/2007 | Balseanu et al. |
| 2007/0251444 A1 | 11/2007 | Gros-Jean et al. |
| 2008/0081470 A1 | 4/2008 | Clark |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0209081 A1* | 8/2009 | Matero ................ C23C 16/401 257/E21.546 |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0148903 A1 | 6/2010 | Yin et al. |
| 2010/0210118 A1* | 8/2010 | Mizuno ............. H01L 21/02164 438/770 |
| 2010/0233886 A1 | 9/2010 | Yang et al. |
| 2010/0239742 A1 | 9/2010 | Larson-Smith et al. |
| 2010/0297545 A1 | 11/2010 | Yoo et al. |
| 2010/0330425 A1* | 12/2010 | Lopatin ................ H01M 50/46 429/231.95 |
| 2011/0159202 A1 | 6/2011 | Matsushita et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0119283 A1 | 5/2012 | Lee et al. |
| 2012/0122302 A1* | 5/2012 | Weidman .......... H01L 21/02274 118/723 R |
| 2012/0141770 A1 | 6/2012 | Cadet et al. |
| 2012/0208347 A1 | 8/2012 | Hwang et al. |
| 2012/0269962 A1* | 10/2012 | Blomberg ......... C23C 16/45531 427/126.3 |
| 2013/0034963 A1 | 2/2013 | Chung et al. |
| 2013/0078454 A1 | 3/2013 | Thompson et al. |
| 2013/0084714 A1 | 4/2013 | Oka et al. |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0196516 A1* | 8/2013 | Lavoie ............. C23C 16/45536 257/E21.293 |
| 2013/0330935 A1 | 12/2013 | Varadarajan |
| 2014/0030432 A1 | 1/2014 | Leu et al. |
| 2014/0030448 A1* | 1/2014 | Bowen ................. C23C 16/325 427/255.28 |
| 2014/0048131 A1 | 2/2014 | Tanaka et al. |
| 2014/0272194 A1 | 9/2014 | Xiao et al. |
| 2014/0273477 A1 | 9/2014 | Niskanen et al. |
| 2014/0273528 A1 | 9/2014 | Niskanen et al. |
| 2014/0273531 A1 | 9/2014 | Niskanen et al. |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0349492 A1 | 11/2014 | Shimamoto et al. |
| 2014/0367764 A1 | 12/2014 | Lee et al. |
| 2015/0021599 A1 | 1/2015 | Ridgeway et al. |
| 2015/0087156 A1 | 3/2015 | Kamimura et al. |
| 2015/0118865 A1 | 4/2015 | Shimizu |
| 2015/0126042 A1 | 5/2015 | Pasquale et al. |
| 2015/0147484 A1* | 5/2015 | Nguyen ............ C23C 16/45536 427/535 |
| 2015/0162185 A1 | 6/2015 | Pore |
| 2015/0214103 A1 | 7/2015 | Matsuda |
| 2015/0217240 A1 | 8/2015 | Van Tuel et al. |
| 2015/0252477 A1 | 9/2015 | Nguyen et al. |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0348778 A1 | 12/2015 | Shimizu et al. |
| 2015/0376211 A1* | 12/2015 | Girard ................... C23C 16/308 556/412 |
| 2015/0380302 A1 | 12/2015 | Mountsier et al. |
| 2016/0002039 A1 | 1/2016 | Thompson |
| 2016/0020091 A1 | 1/2016 | Saly et al. |
| 2016/0064281 A1 | 3/2016 | Izumi et al. |
| 2016/0093485 A1 | 3/2016 | Kobayashi et al. |
| 2016/0108064 A1* | 4/2016 | Kuchenbeiser ......... C23C 16/18 546/14 |
| 2016/0115593 A1 | 4/2016 | Kuchenbeiser et al. |
| 2016/0177445 A1 | 6/2016 | Takahashi et al. |
| 2016/0225616 A1 | 8/2016 | Li et al. |
| 2016/0276148 A1 | 9/2016 | Qian et al. |
| 2016/0307751 A1* | 10/2016 | Pore .................. H01L 21/02208 |
| 2016/0336338 A1 | 11/2016 | Song et al. |
| 2017/0140924 A1 | 5/2017 | Suzuki et al. |
| 2017/0213726 A1 | 7/2017 | Saley et al. |
| 2017/0301539 A1* | 10/2017 | Sano ..................... C23C 16/30 |
| 2017/0309476 A1 | 10/2017 | Venkatasubramanian et al. |
| 2017/0323775 A1 | 11/2017 | Saly et al. |
| 2017/0323782 A1 | 11/2017 | Suzuki et al. |
| 2017/0342559 A1 | 11/2017 | Fukazawa et al. |
| 2017/0352680 A1 | 12/2017 | Shin et al. |
| 2017/0365462 A1 | 12/2017 | Varadarajan |
| 2018/0005814 A1 | 1/2018 | Kumar et al. |
| 2018/0013078 A1 | 1/2018 | Lee et al. |
| 2018/0022761 A1 | 1/2018 | Girard et al. |
| 2018/0122742 A1 | 5/2018 | Ha et al. |
| 2018/0151355 A1 | 5/2018 | Fukazawa |
| 2018/0163312 A1 | 6/2018 | Blomberg ........... H01J 37/3244 |
| 2018/0179628 A1* | 6/2018 | Hashimoto ......... C23C 16/4482 |
| 2018/0182618 A1 | 6/2018 | Blanquart et al. |
| 2018/0269055 A1 | 9/2018 | Hashimoto et al. |
| 2018/0291505 A1 | 10/2018 | Nguyen et al. |
| 2018/0350587 A1 | 12/2018 | Jia et al. |
| 2018/0366314 A1 | 12/2018 | Niskanen et al. |
| 2018/0366319 A1* | 12/2018 | Coley ................... C09D 5/006 |
| 2019/0027357 A1* | 1/2019 | Girard ................ C23C 16/4553 |
| 2019/0311894 A1* | 10/2019 | Girard ................. H01L 21/0214 |
| 2020/0010954 A1 | 1/2020 | Bhuyan et al. |
| 2020/0075322 A1 | 3/2020 | Suzuki et al. |
| 2020/0161438 A1* | 5/2020 | Tang ..................... C23C 16/325 427/255.28 |
| 2020/0273697 A1 | 8/2020 | Suzuki et al. |

(56) References Cited

U.S. PATENT DOCUMENTS

| | | | |
|---|---|---|---|
| 2020/0332415 A1 | 10/2020 | Bhuyan et al. | |
| 2020/0388486 A1* | 12/2020 | Manna | H01L 21/0217 |
| 2020/0395211 A1 | 12/2020 | Jia et al. | |
| 2021/0101917 A1* | 4/2021 | Khandelwal | C23C 16/325 |
| | | | 427/255.28 |
| 2021/0101918 A1* | 4/2021 | Hwang | C23C 16/325 |
| | | | 427/255.28 |
| 2021/0134586 A1 | 5/2021 | Maes et al. | |
| 2021/0225634 A1 | 7/2021 | Sharma | |
| 2022/0234903 A1 | 7/2022 | Pearlstein et al. | |

FOREIGN PATENT DOCUMENTS

| | | | |
|---|---|---|---|
| EP | 0394054 | 10/1990 | |
| EP | 0442490 | 8/1991 | |
| EP | 0526779 | 2/1993 | |
| EP | 0528779 | 2/1993 | |
| EP | 0573033 | 12/1993 | |
| EP | 0774533 | 5/1997 | |
| EP | 0899779 | 3/1999 | |
| EP | 1158070 | 11/2001 | |
| EP | 1167567 | 1/2002 | |
| EP | 2620440 | 7/2013 | |
| EP | 3196336 | 7/2017 | |
| GB | 2148328 A * | 5/1985 | C23C 16/24 |
| JP | 58-033841 | 2/1983 | |
| JP | H06-037041 | 2/1994 | |
| JP | H06-069157 | 3/1994 | |
| JP | H07-230957 | 8/1995 | |
| JP | H08-264530 | 10/1996 | |
| JP | H09-55365 | 2/1997 | |
| JP | 2009-087857 | 3/1997 | |
| JP | 2003-342731 | 12/2003 | |
| JP | 2004-288979 | 10/2004 | |
| JP | 2006-040936 | 2/2006 | |
| JP | 2009-083511 | 4/2009 | |
| JP | 2015-144268 | 8/2015 | |
| KR | 2003-0016346 | 2/2003 | |
| KR | 2003-0057938 | 7/2003 | |
| KR | 2003-0093575 | 12/2003 | |
| KR | 2004-0060402 | 7/2004 | |
| KR | 2004-0079173 | 9/2004 | |
| KR | 2004-0079175 | 9/2004 | |
| KR | 2004-0100767 | 12/2004 | |
| KR | 2005-0000168 | 1/2005 | |
| KR | 2018-005128 | 1/2018 | |
| KR | 102234260 B1 * | 4/2021 | H01L 21/02123 |
| TW | 2010-210202 | 1/2010 | |
| TW | 2014-03759 | 1/2014 | |
| WO | WO 1996/17107 | 6/1996 | |
| WO | WO 1996/18756 | 6/1996 | |
| WO | WO 1998/51838 | 11/1998 | |
| WO | WO 1999/37655 | 7/1999 | |
| WO | WO 2000/01006 | 1/2000 | |
| WO | WO 2000/04704 | 1/2000 | |
| WO | WO 2000/40772 | 7/2000 | |
| WO | WO 2000/47404 | 8/2000 | |
| WO | WO 2000/47796 | 8/2000 | |
| WO | WO 2000/54320 | 9/2000 | |
| WO | WO 2000/55895 | 9/2000 | |
| WO | WO 2000/63957 | 10/2000 | |
| WO | WO 2001/27347 | 4/2001 | |
| WO | WO 2001/29280 | 4/2001 | |
| WO | WO 2001/29891 | 4/2001 | |
| WO | WO 2001/29893 | 4/2001 | |
| WO | WO 2001/53565 | 7/2001 | |
| WO | WO 2001/66832 | 9/2001 | |
| WO | WO 2001/78213 | 10/2001 | |
| WO | WO 2001/88972 | 11/2001 | |
| WO | WO 2004/077515 | 9/2004 | |
| WO | WO 2006/080782 | 8/2006 | |
| WO | WO 2006/097525 | 9/2006 | |
| WO | WO 2007/041089 | 4/2007 | |
| WO | WO 2008/051851 | 5/2008 | |
| WO | WO-2008051851 A1 * | 5/2008 | C23C 16/32 |
| WO | WO 2008/121478 | 10/2008 | |
| WO | WO 2008/137399 | 11/2008 | |
| WO | WO 2013/043330 | 3/2013 | |
| WO | WO 2018/204709 | 11/2018 | |
| WO | WO 2018/213018 | 11/2018 | |

OTHER PUBLICATIONS

1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[Anon], Sep. 19, 2005.

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.

Andricacos et al., "Damascene copper electroplating for chip", IBM Jour. Research and Dev., 1998, vol. 42, Issue 5, pp. 567-574.

Bain et al., "Deposition of tungsten by plasma enhanced chemical vapour deposition", J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Closser et al., "Molecular Layer Deposition of a Highly Stable Oxycarbide Thin Film Using an Organic Chlorosilane and Water", ACS Appl. Mater. Interfaces 2018, 10, pp. 24266-24274.

Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.

Elers et al., "NbCl5 as a precursor in atomic layer epitaxy", Applied Surface Science, Jul. 9, 1994, vol. 82/83, pp. 468-474.

Favis et al., "Atomic layer epitaxy of silicon, silicon/germanium and silicon carbide via extraction/exchange processes", Avail. NTIS. Report, 1991, pp. 33.

File History of U.S. Appl. No. 14/939,984, filed Nov. 12, 2015.
File History of U.S. Appl. No. 15/707,749, filed Sep. 18, 2017.
File History of U.S. Appl. No. 15/707,878, filed Sep. 18, 2017.
File History of U.S. Appl. No. 15/588,026, filed May 5, 2017.
File History of U.S. Appl. No. 16/603,555, filed Oct. 7, 2019.
File History of U.S. Appl. No. 15/787,342, filed Oct. 18, 2017.
File History of U.S. Appl. No. 15/951,626, filed Apr. 12, 2018.
File History of U.S. Appl. No. 15/951,644, filed Apr. 12, 2018.
File History of U.S. Appl. No. 16/208,350, filed Dec. 3, 2018.
File History of U.S. Appl. No. 17/072,480, filed Oct. 16, 2020.
File History of U.S. Appl. No. 16/811,258, filed Mar. 6, 2020.

Fuyuki et al., "Atomic layer epitaxy controlled by surface super-structures in silicon carbide", Thin Solid Films, 1993, vol. 225, Issue 1-2, pp. 225-229.

Fuyuki et al., "Atomic layer epitaxy of cubic silicon carbide by gas source MBE using surface superstructure", J. Cryst. Growth, 1989, vol. 95, Issue 1-4, pp. 461-463.

Gallis et al., "White light emission from amorphous silicon oxycarbide (a—SiCxOy) thin films: Role of composition and postdeposition annealing", Applied Physics Letters 97, 2010, pp. 0810905-1-0810905-3.

Girolami et al., "Tailored Organometallics as Low-Temperature CVD Precursors to Thin Films", Materials Research Society Symposium Proceedings, 1988, vol. 121, pp. 429-438.

Gordon et al., "A Kinetic Model for Step Coverage by Atomic Layer Deposition in Narrow Holes or Trenches", Chemical Vapor Deposition, 2003, vol. 9, No. 2, pp. 73-78.

Hara et al., "Atomic layer control of .beta.-silicon carbide (001) surface", Springer Proc. Phys., 1992, pp. 90-95.

(56) References Cited

OTHER PUBLICATIONS

Hiltunen et al., "Nitrides of titanium, niobium, tantalum and molybdenum grown as thin films by the atomic layer epitaxy method", Thin Solid Films, 1988, vol. 166, pp. 149-154.

Hultman et al., "Review of the Thermal and Mechanical Stability of TiN-based Thin Films" Zeitscrift Fur Metallkunde 90 (10): 803-813 (1999).i.

Ibrahim et al., "Organosilica bis(triethoxysilyl)ethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.

Ihanus et al., "ALE growth of ZnS1—xSex thin films by substituting surface sulfur with elemental selenium," Appl. Surface Sci., 112:154-158 (1997).

International Search Report and Written Opinion dated Apr. 7, 2008, Application No. PCT/US2007/082131.

International Search Report and Written Opinion dated Jun. 25, 2015 in Application No. PCT/US2015/023492.

Jehn et al., "Gmelin Handbook of Inorganic and Organometallic Chemistry", 8th Edition, 1993, vol. A 5b, Issue 54, pp. 131-154.

Jeon et al., "A Study on the Characteristics of TiN Thin Film Deposited by Atomic Layer Chemical Vapor Deposition Method", J. Vac .Sci. Technol. A, 2000, vol. 18, Issue 4, pp. 1595-1598.

Juppo et al., "Deposition of copper films by an alternate supply of CuCl and Zn", J. Vac. Sci. Technol A, Jul./Aug. 1997, vol. 15, Issue 4, pp. 2330-2333.

Kattelus et al., "Electrical Properties of Tantalum Based Composite Oxide Films," Mat. Res. Soc. Symp. Proc. vol. 284, pp. 511-516 (1993).

Kattelus et al., "Layered tantalum-aluminum oxide films deposited by atomic layer epitaxy," Thin Solid Films, Vo. 225, pp. 296-298 (1993).

Kim et al., "Atomic-layer-deposited $WN_xC_y$ thin films as diffusion barrier for copper metallization", Applied Physics Letters, Jun. 23, 2003, vol. 82, Issue 25, pp. 4486-4488.

Kim et al., "Novel capacitor technology for high density stand-alone and embedded DRAMs," IEEE International Electron Devices Meeting, IEDM (2000).

Kirk-Othmer, Encyclopedia of Chemical Technology, John Wiley & Sons, Inc., 1992, vol. 4, pp. 841-878.

Klaus et al., "Atomic Layer Deposition of Tungsten Nitride Films Using Sequential Surface Reactions", Journal of the Electrochemical Society, 2000, vol. 147, Issue 3, pp. 1175-1181.

Klaus et al., "Atomic layer deposition of tungsten using sequential surface chemistry with a sacrificial stripping reaction", Thin Solid Films, 2000, vol. 360, pp. 145-153.

Klaus et al., "Atomic layer deposition of tungsten and tungsten nitride using sequential surface reactions", AVS 46th International Symposium, 1999, Seattle, WA, US.

Klaus et al., "Atomically controlled growth of tungsten and tungsten nitride using sequential surface reactions", Applied Surface Science, 2000, vol. 162-163, pp. 479-491.

Kukli et al., "Properties of $(Nb_{1-x}Ta_x)_2O_5$ Solid Solutions and $(Nb_{1-x}Ta_x)_2O_5$—$ZrO_2$ Nanolaminates Growth by Atomic Layer Epitaxy", NanoStructured Materials, 1997, vol. 8, pp. 785-793.

Lai et al., "Precursors for Organometallic Chemical Vapor Deposition of Tungsten Carbide Films", Chem. Mater., 1995, vol. 7, pp. 2284-2292.

Lakomaa et al., "Surface reactions in $Al_2O_3$ growth from trimethylaluminum and water by atomic layer epitaxy", Applied Surface Science, vol. 107, pp. 107-115 (1996).

Lee et al., "Characteristics of low-k SiOC films deposited via atomic layer deposition", Thin Solid Films 645 (2018), pp. 334-339.

Leskelä et al., "ALD precursor chemistry: Evolution and future challenges", Jour. Phys. IV France 9, 1999, pp. 837-852.

Ludviksson et al., "Low-Temperature Thermal CVD of Ti—Al Metal Films Using a Strong Reducing Agent", Chem. Vap. Deposition, 1998, vol. 4, Issue 4, pp. 129-132.

Martensson, "Use of atomic layer epitaxy for fabrication of Si/TiN/Cu structures", J. Vac. Sci. Technol. B, Sep./Oct. 1999, vol. 17, Issue 5, pp. 2122-2128.

Martensson et al., "Atomic Layer Epitaxy of Copper and Tantalum", Chemical Vapor Deposition, 1997, vol. 3, Issue 1, pp. 45-50.

Martensson et al., "CU(THD)2 As Copper Source in Atomic Layer Epitaxy", Electrochemical Society Proceedings, vol. 97-25, (1997) pp. 1529-1536.

Matsunami et al., "Hetero-interface control and atomic layer epitaxy of SiC", Applied Surface Science, 1997, vol. 112, pp. 171-175.

Min et al., "Atomic Layer Deposition of TiN Films by Alternate Supply of Tetrakis (ethylmethylamino)-Titanium and Ammonia", Jpn. J. Appl. Phys., 1998, vol. 37, pp. 4999-5004.

Min et al., "Atomic Layer Deposition of TiN Thin Films by Sequential Introduction of Ti Precursor and HN3", Mat. Res. Soc. Symp. Proc., 1998, vol. 514, pp. 337-342.

Nakajima et al., "Chemical Vapor Deposition of Tungsten Carbide, Molybdenum Carbide Nitride, and Molybdenum Nitride Films", J. Electrochem. Soc., Jun. 1997, vol. 144, Issue 6, pp. 2096-2100.

Polyakov et al., "Growth of GaBN Ternary Solutions by Organometallic Vapor Phase Epitaxy", Journal of Electronic Materials, 1997, vol. 26, Issue 3, pp. 237-242.

Ritala et al., "Atomic layer epitaxy growth of TiN thin films", J. Electrochem. Soc., 1995, vol. 142, Issue 8, pp. 2731-2737.

Ritala et al., "Atomic Layer Epitaxy Growth of TiN Thin Films from Til4 and NH3", J. Electrochem. Soc., Aug. 1998, vol. 145, Issue 8, pp. 2914-2920.

Ritala et al., "Controlled Growth of TaN, Ta3N5, and TaOxNy Thin Films by Atomic Layer Deposition", Chem. Mater., 1999, vol. 11, pp. 1712-1718.

Ritala et al., "Effects of intermediate zinc pulses on properties of TiN and NbN films deposited by atomic layer epitaxy", Appl. Surf. Sci., 1997, vol. 120, pp. 199-212.

Ritala et al., "Perfectly conformal TiN and $Al_2O_3$ films deposited by atomic layer deposition", Chem. Vapor Deposition, 1999, vol. 5, pp. 7-9.

Ritala et al., "Surface roughness reduction in atomic layer epitaxy grown of titanium dioxide thin films", Thin Solid Films, vol. 249, pp. 155-162 (1994).

Sadayuki et al., "Sub-atomic layer growth of SiC at low temperatures", Japanese Journal of Applied Physics, 1995, vol. 34, Issue 11, pp. 6166-6170.

Sherman et al., "Plasma enhanced atomic layer deposition of Ta for diffusion barrier applications", AVS 46th International Symposium, Oct. 26, 1999, Seattle, WA, US.

Song et al., "Formation of Tantalum Carbide and Nitride Phases in Atomic Layer Deposition Using Hydrogen Plasm and tert-Butylimidotris(diethylamido)-tantalum (TBTDET), and its Effect on Material Properties", Chemical Vapor Deposition, 2008, vol. 14, pp. 334-338.

Suntola, "Atomic Layer Epitaxy," Handbook of Crystal Growth 3, Ch. 14, pp. 601-663 (1994).

Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.

Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.

Tulhoff et al., Ullmann's Encyclopedia of Industrial Chemistry, 5th, Completely Revised Edition, 1986, vol. A5, pp. 61-77.

U.S. Appl. No. 10/049,125, filed Aug. 20, 2002 file history, including but not limited to, Office Action dated Apr. 8, 2004, Office Action dated Jun. 18, 2003, and Office Action dated Oct. 27, 2003.

U.S. Appl. No. 10/242,368, filed Sep. 12, 2002 file history, including but not limited to, Office Action dated Oct. 20, 2004, Office Action dated Apr. 27, 2004, and Notice of Allowance dated Jul. 19, 2005.

U.S. Appl. No. 10/969,297 filed Oct. 19, 2004 file history, including but not limited to, Office Action dated Oct. 11, 2006, Office Action dated Apr. 12, 2007, and Notice of Allowance dated Sep. 18, 2007.

(56) References Cited

OTHER PUBLICATIONS

U.S. Appl. No. 11/286,203, filed Nov. 22, 2005 file history, including but not limited to Office Action dated Sep. 28, 2007.
U.S. Appl. No. 11/288,872, filed Nov. 28, 2005 file history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 file history, including but not limited to, Office Action dated Sep. 4, 2008, Office Action dated May 28, 2009, and Notice of Allowance dated Sep. 4, 2009.
U.S. Appl. No. 14/939,984, filed Nov. 12, 2015 file history, including but not limited to, Office Action dated Feb. 3, 2017, and Notice of Allowance dated Jun. 7, 2017.
U.S. Appl. No. 15/342,943, filed Nov. 3, 2016 file history, including but not limited to Notice of Allowance dated Jun. 13, 2017.
U.S. Appl. No. 14/255,799, filed Apr. 17, 2014 file history, including but not limited to, Office Action dated Dec. 1, 2016, Final Office Action dated Aug. 29, 2017, and Advisory Action dated Dec. 21, 2017.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.
Wong et al., "Barriers for copper interconnections, Solid State Technology", 1999, pp. 1-7.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
Yang et al., "Atomic Layer Deposition of Tungsten Film from WF6/B2H6: Nucleation Layer for Advanced Semiconductor Devices", Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Shang; Chen et al., Selective Deposition of Metallic Films (KR 102234260 B1), [Annotated Foreign Patent Reference, pp. 12-13], Published Apr. 1, 2021, Filed May 8, 2018 (Year:2021).

\* cited by examiner

FORMATION OF SiOCN THIN FILMS

REFERENCE TO RELATED APPLICATION

This application claims priority to U.S. Provisional Application No. 62/962,667, filed on Jan. 17, 2020, which is incorporated by reference herein in its entirety.

BACKGROUND

Field of the Invention

The present disclosure relates generally to the field of semiconductor device manufacturing and, more particularly, to formation of silicon oxide as well as other silicon-containing films.

Description of the Related Art

There is increasing need for dielectric materials with relatively low dielectric constant (k) values and relatively low acid-based or base-based wet etch rates. Typically, deposition processes for forming oxygen containing silicon-based films require a separate oxygen reactant such as ozone or oxygen plasma, and relatively high deposition temperature in the case of thermal processes.

SUMMARY

In some aspects, vapor deposition processes for depositing silicon-containing films are provided. In some embodiments the vapor deposition processes are cyclic processes comprising one or more deposition cycles in which the substrate is sequentially contacted with two or more reactants, including a silicon reactant, such as a silicon halide, and an amine reactant.

In some embodiments methods of depositing a silicon-containing thin film on a substrate in a reaction space comprise a cyclic vapor deposition process, such as an atomic layer deposition (ALD) process, in which at least one deposition cycle comprises contacting the substrate with a vapor phase silicon precursor, an amine reactant, and an acyl halide or carboxylic acid reactant. In some embodiments the silicon reactant is a halosilane. In some embodiments the substrate is contacted with the acyl halide or carboxylic acid reactant, the amine reactant and the silicon precursor, in that order. In some embodiments the substrate is contacted with the silicon precursor, the amine reactant and the acyl halide or carboxylic acid reactant, in that order. In some embodiments the deposition cycles are carried out at a temperature of about 100 to about 450° C.

In some embodiments the substrate is also contacted with a second amine reactant in one or more deposition cycles. In some embodiments the second amine reactant is the same as the first amine reactant. In some embodiments the substrate is contacted with the silicon precursor, the first amine reactant, the acyl halide or carboxylic acid reactant and the second amine reactant, in that order. In some embodiments the substrate is contacted with the acyl halide or carboxylic acid reactant, the first amine reactant, the silicon reactant and the second amine reactant, in that order. In some embodiments the substrate is additionally contacted with a hydrogen reactant, such as $NH_3$, $N_2H_2$ or an alkyl substituted hydrazine. In some embodiments the hydrogen reactant is a pnictogen hydride. In some embodiments in a deposition cycle a substrate is sequentially contacted with the silicon reactant, the hydrogen reactant, the acyl halide or carboxylic acid reactant, and the amine reactant, in that order.

In some embodiments the silicon reactant has the formula $Si_nX_{2n+2}$, where X is a halogen and n is an integer from 1 to 4. In some embodiments the silicon reactant is an alkylhalosilane. In some embodiments the silicon reactant is octachlorotrisilane. In some embodiments the acyl halide reactant comprises a diacyl halide or triacyl halide. In some embodiments the carboxylic acid reactant comprises a dicarboxylic acid or tricarboxylic acid. In some embodiments the amine reactant comprises a diamine or triamine.

In some embodiments the silicon-containing thin films comprise from about 0 to about 30 at % nitrogen and about 0 to about 30 at % carbon. In some embodiments the silicon-containing thin films comprise from about 3 to about 30 at % nitrogen and about 3 to about 30 at % carbon. In some embodiments the silicon-containing films are SiOCN films. In some embodiments the silicon-containing films that are deposited have a wet etch rate of greater than 30 nm/min in dilute HF (0.5 weight % aqueous solution). In some embodiments the silicon-containing thin films have a k value of less than about 6.5.

DETAILED DESCRIPTION

Figure 1:
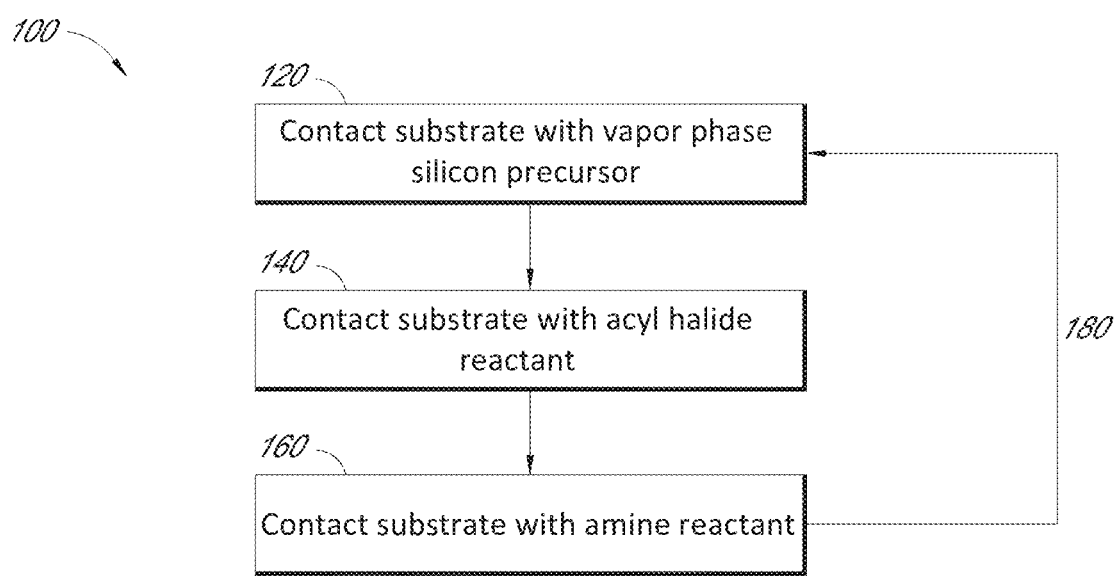
FIG. 1 is a process flow diagram for depositing a silicon-containing thin film by an atomic layer deposition (ALD) process according to some embodiments.

Silicon-containing thin films, such as films comprising one or more of silicon oxide, silicon oxycarbide, silicon oxynitride and silicon oxycarbonitride, have a wide variety of applications, for example, in integrated circuit fabrication. In some embodiments, the silicon-containing films described herein may be useful as, for example, dielectric layers, etch stop layers, sacrificial layers, low-k spacers, anti-reflection layers (ARL), passivation layers and in gap fill applications. While referred to herein broadly as Si(O, C,N) films, hydrogen can also be present in the silicon-containing films.

In some embodiments silicon-containing films are deposited by a vapor phase molecular layer deposition (MLD) process. As discussed in more detail below, in some embodiments a vapor phase deposition process utilizes silicon precursors, such as silicon halides, as well as organic amines, organic acyl halides or organic carboxylic acid precursors. According to some embodiments, the silicon halides may contain more than one silicon atom bridged by either alkyl or aryl carbon chains or carbon atoms, or oxygen, or nitrogen atoms. In some embodiments organic amines may include any substituted or unsubstituted, saturated or unsaturated, alkyl or aryl di-amines or tri-amines. In some embodiments organic acyl halides may include any substituted or unsubstituted, saturated or unsaturated, alkyl or aryl di-acyl or tri-acyl halides. In some embodiments organic carboxylic precursors may include any substituted or unsubstituted, saturated or unsaturated, either alky or aryl di- or tri-carboxylic acids.

In some embodiments, silicon-containing films are formed from a MLD process in which the silicon precursor is an amino silane, such as hexakis(ethylamino)disilane, tetrakis(ethylamino)silane, or tetrakis(methylamino)silane, and the organic precursor is di/tri-acyl halide or a di/tri-carboxylic acid. In some embodiments the organic precursor is a fumaryl chloride, malonyl chloride, terephthaloyl chloride, terephthalic acid, oxalic acid, fumaric acid, etc.

According to some embodiments, various silicon-containing films, precursors, and methods for depositing said films by vapor deposition processes, such as atomic layer deposition (ALD), are provided. In some embodiments the films are deposited by processes that do not use plasma, radicals or excited species. In some embodiments the films are deposited using non-oxidative processes; that is, processes that do not use an oxidizing agent such as $O_2$, $O_3$, $H_2O_2$, $H_2O$, oxygen plasma, or oxygen radicals.

In some embodiments, an additional step can be provided intermittently in the deposition process, for example, after a certain number of deposition cycles, such as after every $n^{th}$ cycle, where n is an integer. In the additional step the substrate may be exposed to one or more reactants to further fine-tune the film properties, improve the process, or selectively remove undesired elements. In some embodiments an additional step of chemical exposure may assist in completing the chemical reaction or reducing or completely removing unnecessary particles such as ammonium chloride salts from the reaction chamber, wafer surface, or the reaction chamber parts. In some embodiments an additional step comprises exposing the substrate to a reactant comprising carbon, hydrogen and nitrogen, or carbon, hydrogen, oxygen and nitrogen, or carbon, hydrogen and sulfur, or carbon, hydrogen, sulfur and nitrogen. In some embodiments an additional step may comprise exposing the substrate to one or more heterocyclic compounds, such as pyridine, alkyl substituted pyridines, pyrrole, imidazole, thiophene, etc. In some embodiments an additional step comprises exposing the substrate to a cyclic molecule that may comprise hetero atoms such as carbon, hydrogen, nitrogen or carbon, hydrogen, nitrogen and sulfur.

In some embodiments the substrate may be exposed to one or more additional reactants, such as those described above, in a purge step for removing one or more reactants and/or reaction by-products, rather than in an additional step. In some embodiments a purge step is provided in which the substrate is exposed to one or more heterocyclic compounds such as pyridine, alkyl substituted pyridines, pyrrole, imidazole, thiophene etc. In some embodiments a purge comprises exposing the substrate to a non-reactive gas like diatomic nitrogen or argon and a heterocyclic compound, for example, pyridine, alkyl substituted pyridines, pyrrole, imidazole, pyrimidine, thiophene, etc.

In some embodiments Si(O,C,N) thin films are not deposited by liquid phase methods. In some embodiments a Si(O,C,N) thin film is deposited over a three dimensional structure, such as a fin in the formation of a FinFET device.

The formula of the silicon oxide films is generally referred to herein as Si(O,C,N) for convenience and simplicity. Si(O,C,N) films contain silicon and one or more of oxygen, carbon and nitrogen. In some embodiments the Si(O,C,N) film is a silicon oxide film, such as $SiO_2$ or SiO. Silicon oxide can have the formula SiOx in some embodiments, where x is from 0 to 2. In some embodiments the Si(O,C,N) film is a silicon oxycarbide film. IN some embodiments the silicon oxycarbide has the formula SiOC. In some embodiments the Si(O,C,N) film is a silicon oxynitride film. In some embodiments the silicon oxynitride has the formula SiON. In some embodiments the Si(O,C,N) film is a silicon oxycarbonitride film. In some embodiments the silicon oxycarbonitride has the formula SiOCN. As used herein, Si(O,C,N), SiO, SiOC, SiON, and SiOCN are not intended to limit, restrict, or define the bonding or chemical state, for example, the oxidation state of any of Si, O, C, N and/or any other element in the films. Further, in some embodiments the thin films may comprise one or more elements in addition to Si, O, C and/or N. In some embodiments the thin films deposited by the methods herein may comprise an organic component, such as a poly-amide. In some embodiments SiO films that are deposited may comprise Si—O bonds. In some embodiments SiOCN films that are deposited may comprise Si—C bonds, Si—O bonds, and Si—N bonds. In some embodiments the Si(O,C,N) films may comprise about 0% to about 50% silicon on an atomic basis. In some embodiments silicon-containing films may comprise silicon rich films. In some embodiments Si(O,C,N) films may comprise from about 0% to about 60% oxygen on an atomic basis.

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example, with an inert gas. The reaction conditions, such as temperature, reactants, and/or pressure, may be tuned to produce a film with the desired characteristics.

In some embodiments, vapor deposition processes such as ALD processes are used to deposit Si(O,C,N) films. In some embodiments the vapor deposition processes do not utilize an oxidizing reactant. For example, in some embodiments the vapor deposition processes do not use $O_2$, $O_3$, $H_2O_3$, $H_2O$, oxygen plasma or oxygen radicals.

Briefly, a substrate or workpiece is placed in a reaction chamber and subjected to alternately repeated surface reactions. In some embodiments, thin Si(O,C,N) films are formed by repetition of an deposition cycle. In some embodiments, for forming Si(O,C,N) films, each deposition cycle comprises at least three distinct phases. The contacting and removal of a reactant from the substrate may be considered a phase. Four distinct phases are discussed below. In some embodiments, a deposition cycle comprises a first silicon phase and one or more of a second, third and fourth phases described below.

In a first phase, a vapor phase first reactant comprising a silicon halide, such as a halosilane, contacts the substrate and forms no more than about one monolayer on the substrate surface. This reactant is also referred to herein as "the silicon precursor," "silicon-containing precursor," or "silicon reactant." This phase can be referred to as the "silicon phase."

In some embodiments the silicon precursor comprises a silane having at least one halogen. In some embodiments the silicon precursor is a linear, branched, or cyclic halosilane. In some embodiments the silicon precursor may have a general formula:

wherein n is an integer greater than or equal to 1 and X is a halogen. In some embodiments X is Cl, F, Br, or I. In some embodiments the silicon precursor comprises two or more different halides.

In some embodiments the silicon precursor may have a general formula:

wherein n is an integer greater than 1 and X is a halogen. In some embodiments X is Cl, F, Br, or I. In some embodiments the silicon precursor comprises two or more different halides.

In some embodiments the silicon precursor is a carbon substituted halosilane, such as an alkylhalosilane. In some embodiments the silicon precursor is an alkyl bridged halosilane.

In some embodiments the silicon precursor may have a general formula:

wherein n is an integer greater than 1 and X is a halogen. In some embodiments X is Cl, F, Br, or I and Y can be alkyl, substituted alkyl, oxygen, or sulfur. In some embodiments Y can be either a branched or linear chain group and may contain one or more atoms such as carbon, nitrogen, hydrogen and/or sulfur, such as carbon and hydrogen or carbon, sulfur, and hydrogen. In some embodiments the bridged chain may contain a halide atom such as fluorine, chlorine, bromine, or iodine.

In some embodiments the silicon precursor may be, for example, octachlorotrisilane (OCTS), hexachlorodisilane (HCDS), octachlorotrisiloxane (OCTSE) or hexachlorodisiloxane (HCDSE).

In a second phase, a second reactant comprising an amine reactant contacts the substrate. This phase can be referred to as the "amine phase" and the reactant may be referred to as the "amine reactant". In some embodiments the amine is a diamine or triamine. In some embodiments the amine has the formula $C_aN_bH_c$, where a, b and c are integers. In some embodiments c is greater than 2. In some embodiments the amine may comprise a saturated or unsaturated ligand, such as a saturated or unsaturated alkyl or aryl group. In some embodiments the amine may be an aromatic amine, such as an aromatic di- or triamine. In some embodiments the amine may have the formula $NH_2$—R—$NH_2$, where R is a saturated or unsaturated alkyl or aryl group, or $NH_2$—Ar—$NH_2$, where Ar represents an aromatic. In some embodiments the second reactant comprises ethylene diamine. In some embodiments the second reactant comprises propyl triamine, diethylenetriamine, propane triamine or trimethyl silyl substituted alkylene amines such as bis (N-trimethylsilyl ethyleneamine) amide [$(Me_3SiNHCH_2CH_2)_2NH$], etc. In some embodiments the amine reactant may contain up to 20 carbon atoms.

In a third phase, a third reactant comprising an acyl halide contacts the substrate. This phase can be referred to as the "acyl halide phase" and the reactant may be referred to as the "acyl halide reactant". In some embodiments the acyl halide comprises a (—C(O)—X) group such as, (—C(O)—Cl), or (—C(O)—Br), or (—C(O)—F), or or (—C(O)—I) group. In some embodiments the acyl halide is a monoacyl halide, with a general formulae R(Ar)—COX. In some embodiments the acyl halide is a diacyl halide. In some embodiments the acyl halide is a triacyl halide. In some embodiments the molecules with diacyl or triacyl halide groups may contain different halide ligands. Examples of acyl halides with mixed halide ligands are COCl—$C_2H_4$—COBr, 1,3-Benzenedicarbonyl dibromide, 5-carbonyl chloride, etc. In some embodiments the acyl halide has the formula COCl—R(Ar)—COCl, where R is a saturated or unsaturated alkyl or aryl group. In some embodiments the acyl halide is fumaryl chloride or cyclohexanediacyl chloride or malonyl chloride or adipoyl chloride. In some embodiments the acyl halide reactant may contain up to 15 carbon atoms, up to 10 carbon atoms, up to 6 carbon atoms, up to 5 carbon atoms, up to 3 carbon atoms, or up to 2 carbon atoms.

In some embodiments the acyl halide reactant comprises a sulfinyl halide. In this case, the third phase can be referred to as the "sulfinyl halide phase" and the reactant may be referred to as the "sulfinyl halide reactant". In some embodiments the acyl halide comprises a (—S(O)—X) group, where X is a halogen atom such as chlorine, bromine, iodine, or fluorine. In some embodiments the sulfinyl halide is a mono sulfinyl halide, with a general formula R(Ar)—SOX. In some embodiments the sulfinyl halide is a di-sulfinyl halide, with a general formula S(O)X—R(Ar)—S(O)X. In some embodiments the sulfinyl halide may comprise carbon, sulfur, oxygen, hydrogen and halogen atoms. In some embodiments the sulfinyl halide reactant may comprise a saturated or unsaturated ligand, such as a saturated or unsaturated alkyl or aryl group.

In some embodiments a deposition cycle includes a fourth phase in which the substrate is contacted with a fourth reactant comprising a hydrogen precursor. This phase can be referred to as the "hydrogen phase" and the reactant may be referred to as the "hydrogen reactant". In some embodiments the fourth reactant is $NH_3$, $N_2H_4$, or a substituted hydrazine such as dimethyl hydrazine. In some embodiments the fourth reactant is a pnictogen hydride, such as $H_2S$, $PH_3$ or other reactant comprising H—S bonds or P—H bonds.

In some embodiments one or more deposition cycles may be carried out at a process temperature of about 200° C. to about 500° C. In some embodiments the deposition cycle may be carried out at a process temperature of less than or equal to about 200° C. In some embodiments the deposition cycle may be carried out at a process temperature of about 400° C. or greater. The deposition temperature may be adjusted to achieve a thin film with a desired composition. For example, the temperature may be adjusted to achieve a desired N and/or C concentration in the film.

In some embodiments the substrate is not contacted with a reactive species generated by a plasma during one or more deposition cycles. In some embodiments the substrate is not contacted with a reactive species generated by a plasma in any deposition cycle.

Additional phases may be added and phases may be removed as desired to adjust the composition of the final film or improve either the film quality or overall deposition process. Thus, in some embodiments one or more phases are omitted. In some embodiments one or more different deposition cycles are provided in the deposition process.

In some embodiments one or more of the phases may be repeated twice or more times in a single deposition cycle. For example, in some embodiments a deposition cycle may comprise a first phase, a second phase, a third phase and a second iteration of the second phase before beginning the next cycle.

One or more of the reactants may be provided with the aid of a carrier gas, such as Ar, $N_2$, or He. In some embodiments the silicon precursor, the second reactant, the third reactant and/or the fourth reactant are provided with the aid of a carrier gas.

In some embodiments, two or more of the phases may overlap, or be combined. For example, the silicon precursor and the amine reactant may contact the substrate simultaneously in phases that partially or completely overlap. In addition, although referred to as the first, second, third and fourth phases, and the first, second, third and fourth reactants, numbering does not specify the order of the phases or the order in which the substrate is contacted with reactants. That is, the order of the phases may be varied. Each deposition cycle may begin with any one of the phases. Unless specified otherwise, the reactants can contact the substrate in any order, and the process may begin with any of the reactants.

As discussed in more detail below, in some embodiments for depositing a silicon-containing film, one or more deposition cycles begin with the silicon phase, by contacting the substrate with the silicon precursor, followed by the amine phase in which the substrate is contacted with the second reactant, and then the acyl halide phase, in which the substrate is contacted with the third reactant, in that order.

In some embodiments one or more deposition cycles begin with the silicon phase, by contacting the substrate with the silicon precursor, followed by the amine phase in which the substrate is contacted with the second reactant, then the acyl halide phase, in which the substrate is contacted with the third reactant, and then a hydrogen phase, in which the substrate is contacted with a hydrogen reactant, in that order.

In some embodiments one or more deposition cycles begin with the silicon phase, by contacting the substrate with the silicon precursor, followed by the amine phase in which the substrate is contacted with the second reactant, then the acyl halide phase, in which the substrate is contacted with the third reactant, and then a second amine phase, in which the substrate is contacted with an amine reactant for a second time, in that order.

In some embodiments a carboxylic acid phase can also be provided in which the substrate is contacted with a carboxylic acid reactant. In some embodiments the carboxylic acid phase may replace the acyl halide phase or be provided as an additional phase to the acyl halide phase. In some embodiments, in the carboxylic acid phase either an aryl or alkyl dicarboxylic or tricarboxylic acid reactant contacts the substrate. In some embodiments carboxylic acid reactant has a general formula of dicarboxylic acid (COOH—R(Ar)—COOH), tricarboxylic acid (R(Ar)(COOH)$_3$), or mono carboxylic acid (R(Ar)—COOH), where R is either substituted or unsubstituted, linear or branched, saturated or unsaturated alkyl group and Ar is either substituted or unsubstituted aryl groups. In some embodiments carboxylic acid phase comprises contacting the substrate with oxalic acid, propane 1,3 dioic acid, adipic acid or terephthalic acid. In some embodiments the carboxylic acid reactant may contain up to 15 carbon atoms, up to 10 carbon atoms, up to 6 carbon atoms, up to 5 carbon atoms, up to 3 carbon atoms, or up to 2 carbon atoms. In some embodiments the acyl halide phase is replaced by a carboxylic acid phase.

In some embodiments one or more deposition cycles begin with the silicon phase, by contacting the substrate with the silicon precursor, followed by the acyl halide phase, in which the substrate is contacted with the acyl halide reactant, and then an amine phase, in which the substrate is contacted with an amine reactant, in that order.

In some embodiments one or more deposition cycles begin with the silicon phase, by contacting the substrate with the silicon precursor, followed by the acyl halide phase, in which the substrate is contacted with the acyl halide reactant, and then a hydrogen phase, in which the substrate is contacted with a hydrogen reactant, in that order.

In other embodiments one or more deposition cycles may begin by contacting the substrate with a reactant other than the silicon precursor. For example, in some embodiments one or more deposition cycle may begin by contacting the substrate with the third precursor, followed by the silicon precursor and the second precursor.

In some embodiments the substrate on which the deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 5 to 50, in the range of 10 to 200, in the range of 50 to 150, or in the range of 100 to 130.

In some embodiments, the exposed surfaces of the workpiece can be pretreated to provide reactive sites to react with the first phase of the deposition cycle. In some embodiments a separate pretreatment step is not required. In some embodiments the substrate is pretreated to provide a desired surface termination.

In some embodiments the deposited Si-containing films can be treated after deposition, for example to modify the film properties. In some embodiments a separate post-treatment step is not required or carried out. In some embodiments the substrate is post-treated to provide a desired film characteristic. In some embodiments a post-treatment step can be thermal exposure of the film to an oxygen reactant such as oxygen, hydrogen peroxide, water and/or ozone. In some embodiments a post-treatment step can be annealing step under reactive or inert atmosphere. In some embodiments a post-treatment step can be a plasma step such as exposure to helium, argon, hydrogen, oxygen, ozone, $H_2$—$N_2$, or $NH_3$ plasma.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films. In some embodiments the substrate may be moved such that it is contacted with one reactant at a time.

As mentioned above, in some embodiments a gas is provided to the reaction chamber continuously during each deposition cycle, or during the entire deposition process. In some embodiments the gas may comprise noble gas, such as helium or argon. The flowing gas may also serve as a purge gas for the first, second and/or third reactant.

The deposition cycle is repeated until a film of the desired thickness and composition is obtained. In some embodiments the deposition parameters, such as the temperature, precursor flow rate, contacting time, removal time, and/or reactants themselves, may be varied in one or more deposition cycles during the deposition process in order to obtain a film with the desired characteristics.

In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse, and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with a silicon reactant first. After an initial surface termination, if necessary or desired, the substrate is contacted with a first silicon halide reactant. For example, a first silicon reactant pulse may be supplied to a reaction space comprising the substrate. In accordance with some embodiments, the silicon reactant comprises a volatile silicon halosilane species, such as octachlorotrisilane, that is reactive with the substrate surfaces of interest. Accordingly, species of the silicon reactant are adsorbed upon these substrate surfaces. In some embodiments the first reactant pulse self-saturates the substrate surfaces such that any excess constituents of the first reactant do not further react with a molecular layer of the silicon species formed on the substrate in this part of the deposition cycle.

Each reactant can be supplied in gaseous form. The reactant is considered "volatile" for purposes of the present description if the species exhibit sufficient vapor pressure under the process conditions to transport the species to the workpiece in sufficient concentration to saturate exposed surfaces.

In some embodiments the silicon reactant contacts the substrate surface for a period of time from about 0.05 seconds to about 30.0 seconds, about 0.1 seconds to about 10 seconds, about 0.1 seconds to about 3 seconds, or about 0.2 seconds to about 1.0 seconds. The optimum contacting time can be determined by the skilled artisan based on the particular circumstances.

After sufficient time for about a molecular layer to be adsorbed on the substrate surface, excess first silicon reactant and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas, or by flowing a purge gas for a sufficient time to diffuse or purge excess reactants and reactant byproducts, if any, from the reaction space. In some embodiments the excess first silicon precursor is purged with the aid of inert gas, such as nitrogen or argon, which may be flowing throughout the deposition cycle. In some embodiments the substrate may be moved from the reaction space containing the first reactant to a second, different reaction space. In some embodiments, the first reactant is removed for about 0.1 seconds to about 30 seconds, about 0.1 seconds to about 10 seconds, about 0.3 seconds to about 5 seconds, or about 0.3 seconds to about 1 second. Contacting and removal of the silicon reactant can be considered the first or silicon phase of the deposition cycle.

In the second phase, the substrate is contacted with a second reactant comprising an amine, such as a diamine or triamine. The amine may be provided to the substrate in one or more reactant pulses. In some embodiments the second reactant is provided in two or more distinct pulses, without introducing another reactant in between any of the two or more pulses. For example, in some embodiments a diamine or triamine is provided in two or more sequential pulses, without introducing a silicon precursor in between the sequential pulses.

In some embodiments the second reactant contacts the substrate for about 0.1 seconds to about 10 seconds. In some embodiments the second reactant, contacts the substrate for about 0.1 seconds to about 10 seconds, about 0.5 seconds to about 5 seconds, or 0.5 seconds to about 2.0 seconds. However, depending on the reactor type, substrate type, and its surface area, the second reactant contacting time may be even longer than about 10 seconds. In some embodiments, contacting times can be on the order of minutes.

After sufficient time for the second reactant to react with species on the substrate surface, excess second reactant, and reaction byproducts, if any, are removed from the substrate surface. In some embodiments removing excess second reactant and reaction byproducts, if any, may comprise purging the reaction chamber. In some embodiments the reaction chamber may be purged by stopping the flow of the second reactant while continuing to flow a carrier gas, or by flowing a purge gas for a sufficient time to diffuse or purge excess reactants and reactant by-products, if any, from the reaction space. In some embodiments the excess second reactant is purged with the aid of inert gas, such as nitrogen or argon, which may be flowing throughout the deposition cycle. In some embodiments the substrate may be moved from the reaction space containing the second reactant to a different reaction space. In some embodiments, the second reactant is removed for about 0.1 seconds to about 10 seconds, about 0.3 seconds to about 5 seconds, or about 0.3 seconds to about 1 second. Contacting and removal of the second reactant can be considered the second phase of the deposition cycle.

In the third phase, the substrate is contacted with a third reactant comprising an acyl halide. The third reactant may be provided to the reaction chamber containing the substrate in one or more pulses. The third reactant reacts with species present on the substrate surface. In some embodiments, the third reactant contacts the substrate for about 0.1 seconds to about 10 seconds. In some embodiments the third reactant contacts the substrate for about 0.1 seconds to about 10 seconds, 0.5 seconds to about 5 seconds or 0.5 seconds to about 2.0 seconds. However, depending on the reactor type, substrate type and its surface area, the third reactant contacting time may be even longer than about 10 seconds. In some embodiments, contacting times can be on the order of minutes.

In some embodiments the third reactant is provided in two or more distinct pulses, without introducing another reactant in between any of the two or more pulses. For example, in some embodiments a diacyl halide is provided in two or more sequential pulses, without introducing a silicon precursor or other reactant in between the sequential pulses.

After sufficient time for the third reactant to react with species on the substrate surface, excess third reactant, and reaction byproducts, if any, are removed from the substrate surface. In some embodiments removing excess third reactant and reaction byproducts, if any, may comprise purging the reaction chamber. In some embodiments the reaction chamber may be purged by stopping the flow of the third reactant while continuing to flow a carrier gas, or by flowing a purge gas for a sufficient time to diffuse or purge excess reactants and reactant by-products, if any, from the reaction space. In some embodiments the excess third precursor is purged with the aid of inert gas, such as nitrogen or argon, which may be flowing throughout the deposition cycle. In some embodiments the substrate may be moved from the reaction space containing the third reactant to a different reaction space. In some embodiments, the third reactant is removed for about 0.1 seconds to about 10 seconds, about 0.3 seconds to about 5 seconds, or about 0.3 seconds to about 1 second. Contacting and removal of the third reactant can be considered the third phase of the deposition cycle.

In a fourth phase, the substrate is contacted with a fourth reactant comprising a hydrogen precursor, such as ammonia, such that the hydrogen precursor reacts with species on the substrate surface. The fourth phase is optional and may not be included in one or more deposition cycles. In some embodiments no deposition cycles utilize the fourth phase. In some embodiments each deposition cycle includes the fourth phase.

In some embodiments the fourth reactant, for example ammonia, contacts the substrate for about 0.1 seconds to about 10 seconds. In some embodiments the fourth reactant, contacts the substrate for about 0.1 seconds to about 10 seconds, about 0.5 seconds to about 5 seconds, or about 0.5 seconds to about 2.0 seconds. However, depending on the reactor type, substrate type, and its surface area, the fourth reactant contacting time may be even longer than about 10 seconds. In some embodiments, contacting times can be on the order of minutes.

In some embodiments the fourth reactant is provided in two or more distinct pulses, without introducing another reactant in between any of the two or more pulses. For example, in some embodiments ammonia is provided in two or more sequential pulses, without introducing a Si-precursor in between the sequential pulses.

In some embodiments removing excess reactant and reaction byproducts, if any, may comprise purging the reaction chamber. In some embodiments the reaction chamber may be purged by stopping the flow of the fourth reactant while continuing to flow a carrier gas or purge gas for a sufficient time to diffuse or purge excess reactants and reactant byproducts, if any, from the reaction space. In some embodiments the excess fourth reactant is purged with the aid of inert gas, such as nitrogen or argon, which is flowing throughout the deposition cycle. In some embodiments the substrate may be moved from the reaction space containing the fourth reactant to a different reaction space. The removal may, in some embodiments, be from about 0.1 seconds to about 10 seconds, about 0.1 seconds to about 4 seconds, or about 0.1 seconds to about 0.5 seconds. Contacting and removal of the fourth reactant can be considered the fourth phase of the deposition cycle.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example, the substrate may comprise an amorphous carbon layer, graphene, and/or carbon nanotubes.

In some embodiments the substrate may comprise a metal, including, but not limited to Mo, Pt, Ir, Au, W, Cu, Ni, Co, and/or Al. In some embodiments the substrate may comprise a metal nitride, including, but not limited to $SiN_x$, $WN_x$, $CON_x$, $NiN_x$, TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, $Ge_xSb_yTe_z$, and/or GeTe. In some embodiments the substrate may comprise Si. In some embodiments the substrate may comprise a material that would be oxidized or otherwise damaged by exposure to a reactive oxygen source such as an oxygen plasma.

In some embodiments a substrate used in the processes described herein may comprise an organic material. For example, the substrate may comprise an organic material such as a plastic, polymer, and/or photoresist. In some embodiments where the substrate comprises an organic material the reaction temperature of an ALD process may be less than about 400° C., less than about 350° C., less than about 300° C., or less than about 200° C. In some embodiments the reaction temperature may be less than about 150° C., less than about 100° C., less than about 75° C., or less than about 50° C.

In some embodiments where a substrate comprises an organic material, the maximum process temperature may be as low as about 100° C. In some embodiments where the substrate comprises an organic material, the absence of a plasma or an oxidant may allow for deposition of a Si(O,C,N) thin film on an organic material that may otherwise degrade in a deposition process including plasma generated from oxygen or other reactive oxygen species.

According to some embodiments, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a Si(O,C,N) deposition process can be performed at a pressure of about 20 Torr to about 500 Torr, about 20 Torr to about 50 Torr, or about 20 Torr to about 30 Torr.

In some embodiments a Si(O,C,N) deposition process can comprise a plurality of deposition cycles, wherein at least one deposition cycle is performed in an elevated pressure regime. For example, a deposition cycle may comprise alternately and sequentially contacting the substrate with a silicon precursor and a second reactant under the elevated pressure. In some embodiments, one or more deposition cycles can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

In some embodiments a silicon precursor such as a halosilane is utilized in a deposition cycle with an acyl halide and an amine reactant. Referring to FIG. 1 and according to some embodiments, a silicon-containing thin film is deposited on a substrate in a reaction space by an ALD deposition process 100 comprising one or more deposition cycles comprising:

contacting the substrate with a vapor phase silicon precursor, such as a halosilane, for example, octachlorotrisilane, at step 120, such that silicon species are adsorbed onto the surface of the substrate;

contacting the substrate with a second reactant comprising an acyl halide, such as fumaryl chloride at step 140; and contacting the substrate with a third reactant comprising an amine, at step 160, such as an alkyl diamine, for example, ethylene diamine.

The contacting steps 120, 140, 160 may be repeated 180 to form a silicon-containing film of the desired thickness.

Excess reactants and reactant byproducts, if any, may be removed between each contacting step.

In some embodiments the substrate is alternately and sequentially contacted with the silicon precursor, the acyl halide and the amine in that order. In some embodiments the substrate is alternately and sequentially contacted with the acyl halide, followed by the amine and then the silicon precursor. In some embodiments, the order in which the substrate is contacted with the reactants can be adjusted in order to get desired film properties, such as improved adhesion of the films to the substrate, or achieve desired process characteristics, such as enhanced growth rate or decreased growth rate. In some embodiments, the order of reactants can be the silicon precursor first, then an amine precursor, followed by an acyl halide or a carboxylic acid. In some embodiments, the order of reactants can be acyl halide or a carboxylic acid first, followed by an amine reactant, and lastly, a silicon precursor. In some embodiments, one deposition cycle comprises contacting the substrate first with a silicon precursor, then an amine precursor, followed by an acyl halide or a carboxylic acid, and lastly, an amine precursor, in this specific order. In some embodiments, one deposition cycle comprises contacting the substrate first with an acyl halide or a carboxylic acid precursor, then an amine precursor, followed by a silicon precursor, and lastly, an amine precursor, in this specific order.

In some embodiments of a cyclic deposition process, each precursor is separated by a step in which excess reactants and/or reaction byproducts are removed from the reaction space. This may be accomplished by purging, for example with an inert purge gas, and/or by simple evacuation or pumping steps.

In some embodiments a substrate is alternately and sequentially contacted with octachlorotrisilane, fumaryl chloride and ethylene diamine. In some embodiments the substrate is contacted with the three reactants in that order in one or more deposition cycles. In some embodiments the substrate is alternately and sequentially contacted with fumaryl chloride, ethylene diamine and octachlorotrisilane ($Si_3Cl_8$) in that order in one or more deposition cycles.

The temperature of the deposition process illustrated in FIG. 1 may be varied to achieve a desired film. In some embodiments a temperature of about 300° C. or less is utilized and a film comprising SiOCN is formed. The nitrogen and carbon concentration may be tuned by adjusting the temperature. At a deposition temperature of about 300° C. or less, the film may have a nitrogen content of about 3 to about 30 at % N and a carbon content of about 3 to about 30 at % C. In some embodiments at temperatures of about 200° C. or lower, a film may be deposited comprising a smaller amount of carbon and nitrogen, such as about 0 to about 10 at % of each. In some embodiments the film may be a $SiO_x$ film that does not comprise N or C or that comprises a negligible amount of N and/or C.

In some embodiments a temperature of about 300° C. or less is used and a film with a relatively high wet etch rate is formed, such as a wet etch rate in dilute HF of greater than 30 nm/min. In some embodiments a temperature of about 300° C. or less is used and a thin film with a wet etch rate 15 to 25 times greater than the wet etch rate of thermal silicon oxide in dilute HF is formed.

In some embodiments a temperature of about 300° C. or less is used and a thin film with a k value less than about 5 is formed.

In some embodiments a temperature of greater than about 300° C. is utilized and a film comprising SiOCN is formed. In some embodiments a temperature of about 300° C. or greater is utilized and a film with a nitrogen content of about 3 to about 30 at % N and a carbon content of about 3 to about 30 at % C is formed. The carbon and nitrogen concentration can be varied by varying the temperature.

In some embodiments a temperature greater than about 300° C. is used and a film with a wet etch rate in dilute HF (0.5 weight % aqueous solution) of less than about 50 nm/min is formed. In some embodiments a temperature of greater than about 300° C. is used and a thin film with a wet etch rate that is up to 15 to 25 times the wet etch rate of thermal silicon oxide in dilute HF (0.5 weight % aqueous solution) is formed.

In some embodiments a temperature of greater than 300° C. is used and a thin film with a k value of greater than about 4.5 is formed. In some embodiments the k value is less than about 6.5. The k value may be tuned by adjusting the deposition temperature.

Figure 2:
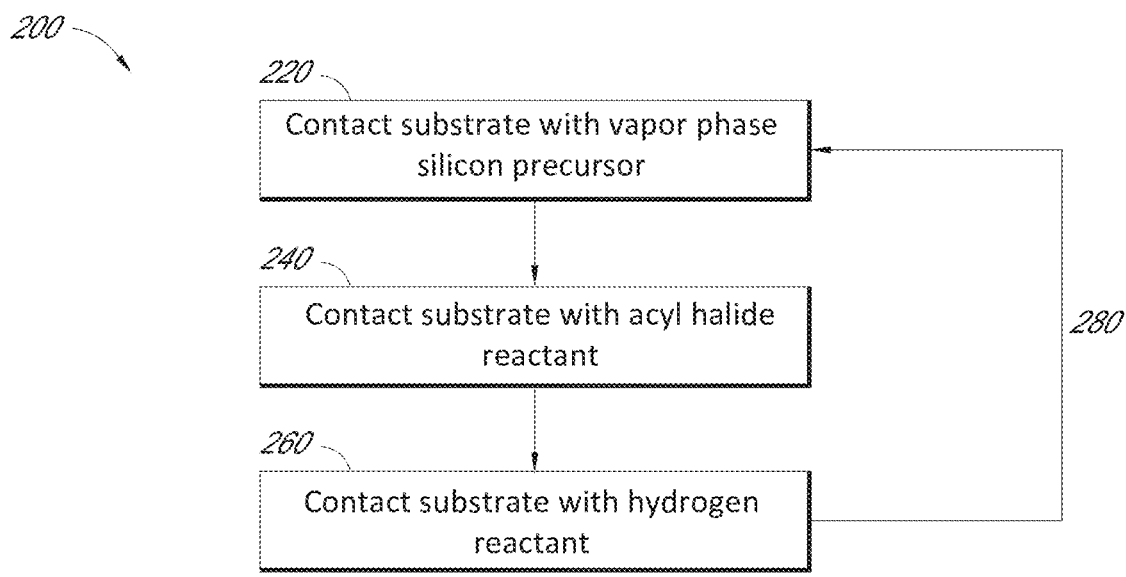
FIG. 2 is a process flow diagram for depositing a silicon-containing thin film by an ALD process according to some embodiments.

In some embodiments a silicon precursor such as a halosilane is utilized in a deposition cycle with an acyl halide and a hydrogen reactant. With reference to FIG. 2 and according to some embodiments, a silicon-containing thin film is deposited on a substrate in a reaction space by an ALD deposition process 200 comprising at least one cycle comprising:

contacting the substrate with a vapor phase silicon precursor at step 220 such that silicon species are adsorbed onto the surface of the substrate;

contacting the substrate with a second reactant comprising an acyl halide, such as fumaryl chloride at step 240; and contacting the substrate with a third reactant comprising a hydrogen reactant, such as hydrazine or $NH_3$ at step 260.

The contacting steps 220, 240, 260 may be repeated 280 to form a silicon-containing film of the desired thickness.

Excess reactants and reactant byproducts, if any, may be removed between each contacting step.

In some embodiments the substrate is alternately and sequentially contacted with the silicon precursor, the acyl halide and the hydrogen reactant in that order. In some embodiments the substrate is alternately and sequentially contacted with the hydrogen reactant, followed by the amine and then the silicon precursor.

In some embodiments a substrate is alternately and sequentially contacted with octachlorotrisilane ($Si_3Cl_8$), fumaryl chloride, and ammonia. In some embodiments the substrate is contacted with the three reactants in that order in one or more deposition cycles. In some embodiments the substrate is alternately and sequentially contacted with octachlorotrisilane ($Si_3Cl_8$), ammonia and fumaryl chloride in that order in one or more deposition cycles.

The temperature of the deposition process illustrated in FIG. 2 may be varied to achieve a desired film. In some embodiments a temperature of about 300° C. or less is utilized and a film comprising primarily $SiO_2$ is formed. In some embodiments a temperature of about 300° C. or less is utilized and a film with low or negligible nitrogen and carbon content is formed. For example, the film may have a nitrogen content of about 0 to about 10 at % N and a carbon content of about 0 to about 10 at % C. The carbon and nitrogen concentration can be varied by varying the temperature. In some embodiments the carbon and nitrogen concentrations are reduced or minimized by carrying out the reaction at a temperature of about 250° C. or lower.

In some embodiments a temperature of about 300° C. or less is used and a film with a wet etch rate in dilute HF, such as 0.5% HF, of greater than about 30 nm/min is formed. In some embodiments a temperature of about 300° C. or less is used and a thin film with a wet etch rate at least 15 to 25 times greater than the wet etch rate of thermal silicon oxide in dilute HF (0.5 weight % aqueous solution) is formed. In some embodiments a temperature of about 300° C. or less is used and a thin film with a k value less than about 5 is formed.

In some embodiments a temperature of greater than about 200° C., for example about 200° C. to about 400° C. is used and a film comprising SiOCN is formed. The carbon and nitrogen concentration in the film may be tuned by adjusting the temperature. In some embodiments a temperature of about 300° C. or greater is utilized and a film with a nitrogen content of about 3 to about 30 at % N and about 3 to about 30 at % C is formed.

In some embodiments a temperature of greater than about 300° C. is used and a film with a wet etch rate in dilute HF of less than about 50 nm/min is formed. In some embodiments a temperature of greater than about 300° C. is used and a thin film with a wet etch rate that is up to 15 to 25 times the wet etch rate of thermal silicon oxide in dilute HF (0.5 weight % aqueous solution) is formed.

In some embodiments a temperature of greater than about 300° C. is used and a thin film with a k value of greater than about 4.5 is formed. The k value may be tuned by adjusting the temperature.

Figure 3:
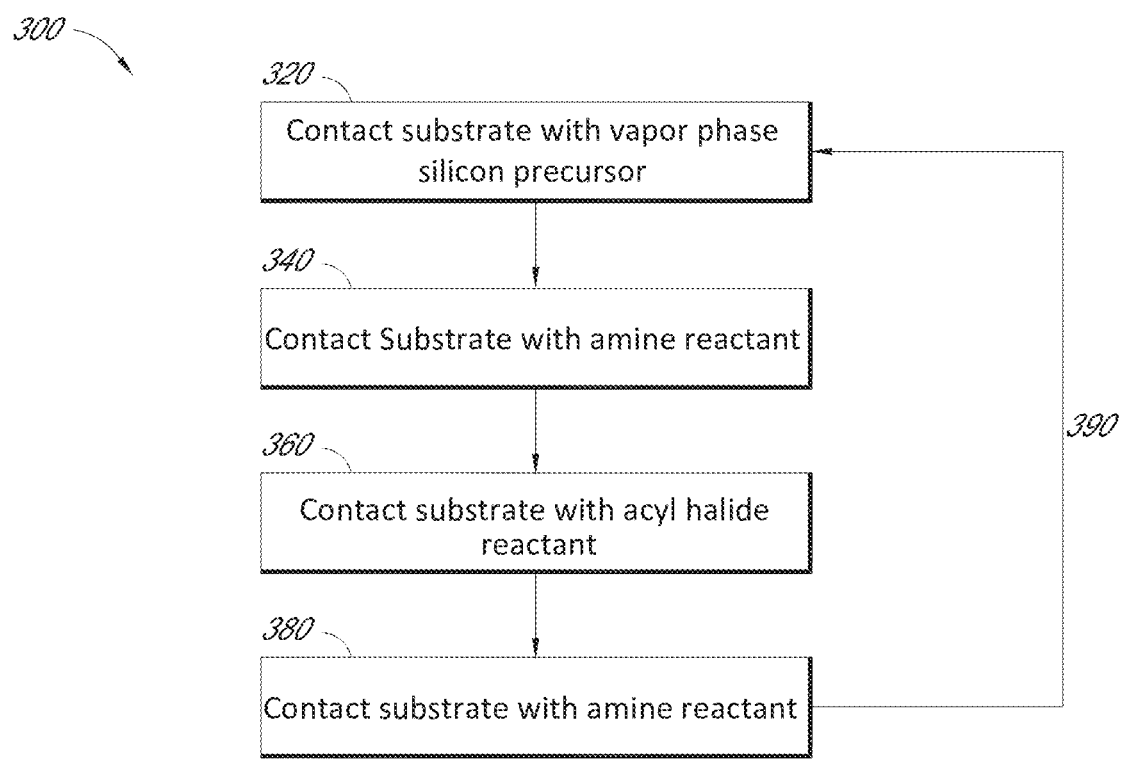
FIG. 3 is a process flow diagram for depositing a silicon-containing thin film by an ALD process according to some embodiments.

In some embodiments a silicon precursor such as a halosilane is utilized in a deposition cycle with reactant comprising an acyl halide and an amine reactant, where the amine reactant is provided both after contacting the substrate with the silicon precursor and after contacting the substrate with the acyl halide. With reference to FIG. 3 according to some embodiments, a silicon-containing thin film is deposited on a substrate in a reaction space by an ALD deposition process 300 comprising at least one cycle comprising:

contacting the substrate with a vapor phase silicon precursor at step 320, such as a halosilane, such that silicon species are adsorbed onto the surface of the substrate;

contacting the substrate with a second reactant comprising an amine, such as a diamine or triamine, for example ethylene diamine, at step 340;

contacting the substrate with a third reactant comprising an acyl halide, such as fumaryl chloride, at step 360; and contacting the substrate a second time with an amine reactant, such as a diamine or triamine, for example ethylene diamine, at step 380. In some embodiments the amine reactant used at step 380 is the same as the amine reactant used at step 340. In some embodiments different reactants are used at steps 340 and 380.

The contacting steps 320, 340, 360 and 380 may be repeated 390 to form a silicon-containing film of the desired thickness. In some embodiments the film that is deposited is a SiOCN film. In some embodiments the film comprises an organic component, such a poly-amide. In some embodiments the film may be a nanolaminates of SiOCN and a poly-amide.

Excess reactants and reactant byproducts, if any, may be removed between each contacting step.

In some embodiments the substrate is alternately and sequentially contacted with a silicon precursor, an amine reactant, an acyl halide reactant and a second amine reactant in that order.

In some embodiments a substrate is alternately and sequentially contacted with octachlorotrisilane ($Si_3Cl_8$), ethylene diamine, fumaryl chloride, and ethylene diamine. In some embodiments the substrate is contacted with the four reactants in that order in one or more deposition cycles.

In some embodiments a hydrogen reactant such as ammonia may substitute the amine reactant at one or both of steps of 340 and 380. In some embodiments a substrate is alternately and sequentially contacted with a silicon precursor, a hydrogen reactant, an acyl halide reactant, and an amine reactant. For example, in some embodiments a substrate may be alternately and sequentially contacted with a halosilane, such as octachlorotrisilane, ammonia, fumaryl chloride, and ethylene diamine. In some embodiments the substrate is contacted with the four reactants in that order in one or more deposition cycles.

Figure 4:
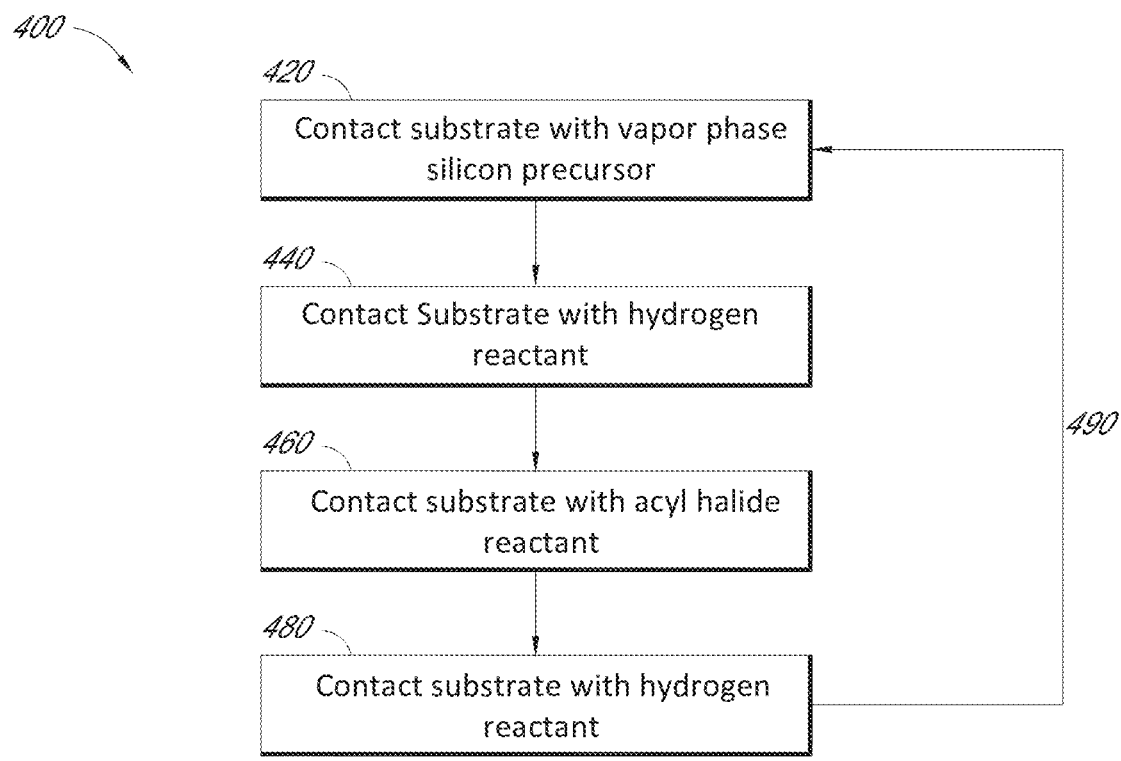
FIG. 4 is a process flow diagram for depositing a silicon-containing thin film by an ALD process according to some embodiments.

In some embodiments a silicon precursor such as a halosilane is utilized in a deposition cycle with a reactant comprising an acyl halide and a hydrogen reactant, where the hydrogen reactant is provided both after contacting the substrate with the silicon precursor and after contacting the substrate with the acyl halide. With reference to FIG. 4, according to some embodiments a silicon-containing, thin film is deposited on a substrate in a reaction space by an ALD deposition process 400 comprising at least one cycle comprising:

contacting the substrate with a vapor phase silicon precursor at step 420, such as a halosilane, such that silicon species are adsorbed onto the surface of the substrate;

contacting the substrate with a second reactant comprising a hydrogen reactant, such as ammonia, at step 440;

contacting the substrate with a third reactant comprising an acyl halide, such as fumaryl chloride, at step 460; and contacting the substrate a second time with a hydrogen reactant, such as ammonia, at step 480. In some embodiments the hydrogen reactant used at step 480 is the same as the amine reactant used at step 440. In some embodiments different reactants are used at steps 440 and 480.

The contacting steps 420, 440, 460 and 480 may be repeated 490 to form a silicon-containing film of the desired thickness. In some embodiments the film that is deposited is a SiOCN film.

Excess reactants and reactant byproducts, if any, may be removed between each contacting step.

In some embodiments the substrate is alternately and sequentially contacted with a silicon precursor, a hydrogen reactant, an acyl halide reactant and a second hydrogen reactant in that order.

In some embodiments a substrate is alternately and sequentially contacted with octachlorotrisilane ($Si_3Cl_8$), ammonia, fumaryl chloride, and ammonia. In some embodiments the substrate is contacted with the four reactants in that order in one or more deposition cycles.

In some embodiments an amine reactant such as ethylene diamine may be substituted for the hydrogen reactant at one or both of steps 440 and 480. In some embodiments a substrate is alternately and sequentially contacted with a silicon precursor, an amine reactant, an acyl halide reactant, and a hydrogen reactant. For example, in some embodiments a substrate may be alternately and sequentially contacted with a halosilane, such as octachlorotrisilane, ethylene diamine, fumaryl chloride, and ammonia. In some embodiments the substrate is contacted with the four reactants in that order in one or more deposition cycles.

Si(O,C,N) Film Characteristics

Si(O,C,N) thin films deposited according to some of the embodiments discussed herein may have levels or concentrations of one or more impurities below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 45 at %, below about 30 at %, below about 20 at %, below about 15 at %, or below about 10 at %. As used herein, an impurity may be considered any element other than Si, O, C, and/or N.

In some embodiments, the deposited Si(O,C,N) films do not comprise an appreciable amount of hydrogen. However, in some embodiments a Si(O,C,N) film comprising hydrogen is deposited. In some embodiments, the deposited Si(O,C,N) films comprise less than about 45 at %, less than about 30 at %, less than about 20 at %, less than about 15 at %, less than about 10 at % or less than about 5 at % of hydrogen. In some embodiments the thin films do not comprise argon.

According to some embodiments, the Si(O,C,N) thin films may exhibit step coverage and pattern loading effects of greater than about 50%, greater than about 80%, greater than about 90%, or greater than about 95%. In some cases, step coverage and pattern loading effects can be greater than about 98% and in some cases about 100% (within the accuracy of the measurement tool or method). In some embodiments step coverage and pattern loading effects can be greater than about 100%, greater than about 110%, greater than about 120%, greater than about 130%, greater than about 140%, or greater than about 200%. These values can be achieved in features with aspect ratios of about 2 or greater, in some embodiments in aspect ratios of about 3 or greater, in some embodiments in aspect ratios of about 5 or greater, and in some embodiments in aspect ratios of about 8 or greater.

In some embodiments the step coverage may be between about 50% and about 110%, between about 80% and about 110%, between about 90% and about 110%, between about 95% and about 110%, between about 98% and about 110%, or between about 100% and about 110%. In some embodiments the step coverage may be between about 50% and about 100%, between about 80% and about 100%, between about 90% and about 100%, between about 95% and about 100%, or between about 98% and about 100%.

In some embodiments the step coverage can depend on the pith or dimensions of the pattern across the silicon or glass wafers. In some embodiments the substrate can be polymer, glass, indium tin oxide (ITO), carbon based, etc.

In some embodiments the growth rate of the film is from about 0.01 Å/cycle to about 5 Å/cycle, or from about 0.1 Å/cycle to about 1 Å/cycle. In some embodiments the growth rate of the film is more than about 0.05 Å/cycle, more than about 0.1 Å/cycle, more than about 0.15 Å/cycle, more than about 0.3 Å/cycle, more than about 0.3 Å/cycle, or more than about 0.4 Å/cycle.

In some embodiments, Si(O,C,N) films are deposited to a thickness of from about 3 nm to about 50 nm, from about 5 nm to about 30 nm, from about 5 nm to about 20 nm. These thicknesses can be achieved in feature sizes (width) below about 100 nm, below about 50 nm, below about 30 nm, below about 20 nm, and in some cases below about 15 nm. According to some embodiments, a Si(O,C,N) film is deposited on a three-dimensional structure and the thickness at a sidewall may be slightly even more than 10 nm. In some embodiments Si(O,C,N) films of greater than about 50 nm can be deposited. In some embodiments Si(O,C,N) films of greater than about 100 nm can be deposited. In some embodiments, Si(O,C,N) films are deposited to a thickness of more than about 1 nm, more than about 2 nm, more than about 3 nm, more than about 5 nm, or more than about 10 nm.

According to some embodiments Si(O,C,N) films with various wet etch rates (WER) may be deposited. When using a blanket WER in 0.5% dHF (nm/min), Si(O,C,N) films may have WER values of less than about 50 nm/min. In some embodiments SiOCN films may have WER values of greater than 30 nm/min in 0.5% dHF.

In some embodiments wherein an ALD process is carried out at temperatures less than about 300° C., the blanket WER in 0.5% dHF (nm/min) may be greater than about 30 nm/min. In addition, the blanket wet etch rate relative to the WER of thermal oxide may be greater than 15 to 25 times.

In some embodiments wherein an ALD process is carried out at temperatures greater than about 300° C., the blanket WER in 0.5% dHF (nm/min) may be less than about 50 nm/min. In addition, the blanket wet etch rate may be up to 15 to 25 times greater than the WER of thermal oxide.

In some embodiments wherein an ALD process is carried out at temperatures greater than about 300° C., the nitrogen concentration in the Si(O,C,N) film may be from about 3 to about 30 at % and the carbon concentration in the Si(O,C,N) film may be from about 3 to about 30 at %. The N and C concentrations can be adjusted by adjusting the temperature.

In some embodiments wherein an ALD process is carried out at temperatures less than about 300° C., the nitrogen concentration in the Si(O,C,N) film may be from about 0 to about 10 at % and the carbon concentration in the Si(O,C,N) film may be from about 0 to about 10 at %. The N and C concentrations can be adjusted by adjusting the temperature.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %.

In some embodiments the deposited Si(O,C,N) thin film may contain up to about 70% oxygen on an atomic basis (at %). In some embodiments a Si(O,C,N) film may comprise oxygen from about 10% to about 70%, from about 15% to about 50%, or from about 20% to about 40% on an atomic basis. In some embodiments a Si(O,C,N) film may comprise at least about 20%, about 40%, or about 50% oxygen on an atomic basis.

In some embodiments the deposited Si(O,C,N) thin film may contain up to about 40% carbon on an atomic basis (at %). In some embodiments a Si(O,C,N) film may comprise carbon from about 0.5% to about 40%, from about 1% to about 30%, or from about 5% to about 20% on an atomic basis. In some embodiments a Si(O,C,N) film may comprise at least about 1%, about 10%, or about 20% carbon on an atomic basis.

In some embodiments the deposited Si(O,C,N) thin film may contain up to about 50% nitrogen on an atomic basis (at %). In some embodiments a Si(O,C,N) film may comprise nitrogen from about 0.5% to about 30%, from about 1% to about 20%, or from about 3% to about 15% on an atomic basis. In some embodiments an Si(O,C,N) film may comprise at least about 1%, about 5%, or about 10% nitrogen on an atomic basis.

In some embodiments the deposited Si(O,C,N) thin film may contain up to about 50% silicon on an atomic basis (at %). In some embodiments a Si(O,C,N) film may comprise silicon from about 10% to about 50%, from about 15% to about 40%, or from about 20% to about 35% on an atomic basis. In some embodiments a Si(O,C,N) film may comprise at least about 15%, about 20%, about 25%. or about 30% silicon on an atomic basis.

In some embodiments the deposited Si(O,C,N) thin film may comprise from about 30 at % to about 40 at % silicon, from about 25 at % to about 40 at % oxygen, from about 10 at % to about 20 at % C, and about 10 at % nitrogen. In some embodiments the deposited Si(O,C,N) film may comprise about 33 at % silicon and about 67 at % oxygen.

As discussed above, in some embodiments a Si(O,C,N) film may comprise Si—C bonds, Si—O bonds, and/or Si—N bonds. In some embodiments a Si(O,C,N) film may comprise Si—C bonds and Si—O bonds, and may not comprise Si—N bonds. In some embodiments a Si(O,C,N) film may comprise Si—N bonds and Si—O bonds, and may not comprise Si—C bonds. In some embodiments a Si(O,C,N) film may comprise Si—N bonds and Si—C bonds, and may not comprise Si—O bonds. In some embodiments the Si(O,C,N) films may comprise more Si—O bonds than Si—C bonds, for example, a ratio of Si—O bonds to Si—C bonds may be from about 1:1 to about 10:1. In some embodiments a deposited Si(O,C,N) film may comprise one or more of SiN, SiOx, SiC, SiCN, SiON, SiOC and SiOCN.

In some embodiments a Si(O,C,N) film is a continuous film. In some embodiments a Si(O,C,N) film has a k-value that is less than about 10. In some embodiments a Si(O,C,N) film has a k-value that is less than about 5. For example, in some embodiments a Si(O,C,N) film that is deposited at a temperature of about 300° C. or less may have a k value of less than about 5. In some embodiments a Si(O,C,N) film has a k-values from about 3.9 to about 10. In some embodiments a Si(O,C,N) film has a k-value that is greater than about 4.5. For example, in some embodiments a Si(O,C,N) is deposited at a temperature of greater than about 300° C. and has a k value of greater than about 4.5. In some embodiments the k value is less than 6.5. The k value may be tuned by adjusting the deposition temperature.

In some embodiments SiOCN films deposited according to the present disclosure do not comprise a laminate or nanolaminate structure. In some embodiments the films that are deposited comprise a nanolaminate of a Si(O,C,N) film and an organic film, such as a poly-amide film.

In some embodiments a Si(O,C,N) film deposited according to the present disclosure does not consist of separate, individual molecules of Si, O, C and/or N which are not bonded to each other.

Exemplary Si(O,C,N) thin films were deposited by an ALD process as described herein.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes, nanoparticles, or even single, partial or full molecular layers, or partial or full atomic layers, or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon-containing thin film on a substrate in a reaction space by a cyclic vapor deposition process comprising at least one deposition cycle comprising:
   contacting the substrate with a vapor phase silicon precursor comprising octachlorotrisiloxane or hexachlorodisiloxane;
   contacting the substrate with an amine reactant; and
   contacting the substrate with an acyl halide reactant.

2. The method of claim 1, wherein the at least one deposition cycle comprises, in order:
   contacting the substrate with the acyl halide reactant;
   contacting the substrate with the amine reactant; and
   contacting the substrate with the vapor phase silicon precursor.

3. The method of claim 1, wherein the at least one deposition cycle comprises, in order:
   contacting the substrate with the vapor phase silicon precursor;
   contacting the substrate with the amine reactant; and
   contacting the substrate with the acyl halide reactant.

4. The method of claim 1, wherein the at least one deposition cycle comprises, in order:
   contacting the substrate with the vapor phase silicon precursor;
   contacting the substrate with the acyl halide reactant; and
   contacting the substrate with the amine reactant.

5. The method of claim 1, wherein the at least one deposition cycle additionally comprises contacting the substrate with a second amine reactant.

6. The method of claim 1, wherein the contacting the substrate with the acyl halide reactant comprises contacting the substrate with the acyl halide reactant, the acyl halide reactant comprises a fumaryl chloride, malonyl chloride, succinyl chloride, trimesoyl chloride, glutaryl chloride, adipoyl dichloride, or phthaloyl chloride.

7. The method of claim 1, wherein the amine reactant comprises an ethylene diamine, phenylenediamine, butanediamine, diaminohexane, diamino propane, or propane triamine.

8. The method of claim 1, wherein the at least one deposition cycle additionally comprises contacting the substrate with a hydrogen reactant.

9. The method of claim 8, wherein the at least one deposition cycle comprises, in order:
   contacting the substrate with the vapor phase silicon precursor;
   contacting the substrate with the hydrogen reactant;
   contacting the substrate with the acyl halide reactant; and
   contacting the substrate with the amine reactant.

10. The method of claim 8, wherein the hydrogen reactant comprises a $NH_3$, $N_2H_2$, any alkyl substituted hydrazine, or pnictogen hydride.

11. The method of claim 1, wherein the at least one deposition cycle comprises alternately and sequentially contacting the substrate, at a temperature of less than 300° C., with the vapor phase silicon precursor, the amine reactant, and the acyl halide reactant.

12. The method of claim 11, wherein the silicon-containing thin film comprises from about 3 to about 30 at % nitrogen and about 3 to about 30 at % carbon.

13. The method of claim 11, wherein the silicon-containing thin film has a wet etch rate of greater than about 30 nm/min in dilute HF (0.5 weight % aqueous solution).

14. The method of claim 11, wherein the silicon-containing thin film has a k-value of less than about 5.

15. The method of claim 1, wherein the at least one deposition cycle comprises alternately and sequentially contacting the substrate with the vapor phase silicon precursor, the amine reactant, and the acyl halide reactant at a temperature of greater than 300° C.

16. The method of claim 15, wherein the silicon-containing thin film has a k-value of more than about 4.5.

17. The method of claim 1, wherein the silicon-containing thin film comprises SiOCN.

* * * * *